United States Patent [19]

Cardinne et al.

[11] 4,009,479
[45] Feb. 22, 1977

[54] JOSEPHSON JUNCTION

[75] Inventors: Philippe Cardinne, Grenoble; Francois Colomb, Echirolles; Bernard Manhes, Grenoble, all of France; James Emery Nordman, Madison, Wis.; Raymond Serve, Eybens, France

[73] Assignee: L'Air Liquide, Societe Anonyme pour l'Etude et l'Exploitation des Procedes Georges Claude, Paris, France

[22] Filed: Dec. 21, 1973

[21] Appl. No.: 427,262

[30] Foreign Application Priority Data

Mar. 30, 1973 France .......................... 73.11541

[52] U.S. Cl. ...................................... 357/5; 357/74
[51] Int. Cl.² .................. H01L 39/22; H01L 23/02
[58] Field of Search ........................... 357/5, 74

[56] References Cited

UNITED STATES PATENTS 3,764,863  10/1973  Zappe ................................. 357/5

Primary Examiner—Edward J. Wojciechowicz
Attorney, Agent, or Firm—Young & Thompson

[57] ABSTRACT

A Josephson junction comprises a cylindrical substrate having a flat end face disposed in a plane perpendicular to the axis of the cylinder. At least two bodies of superconducting material such as niobium, tantalum or vanadium are carried by the substrate and have boundary surfaces disposed in that plane. Insulating material and semiconductor material spaces apart the superconductors; and electrical supply means extend lengthwise of the cylinder to bring electric current to that plane. In one embodiment, the superconductors are disposed on opposite sides of the plane; while in another embodiment, they are all disposed on the same side of the plane.

6 Claims, 13 Drawing Figures

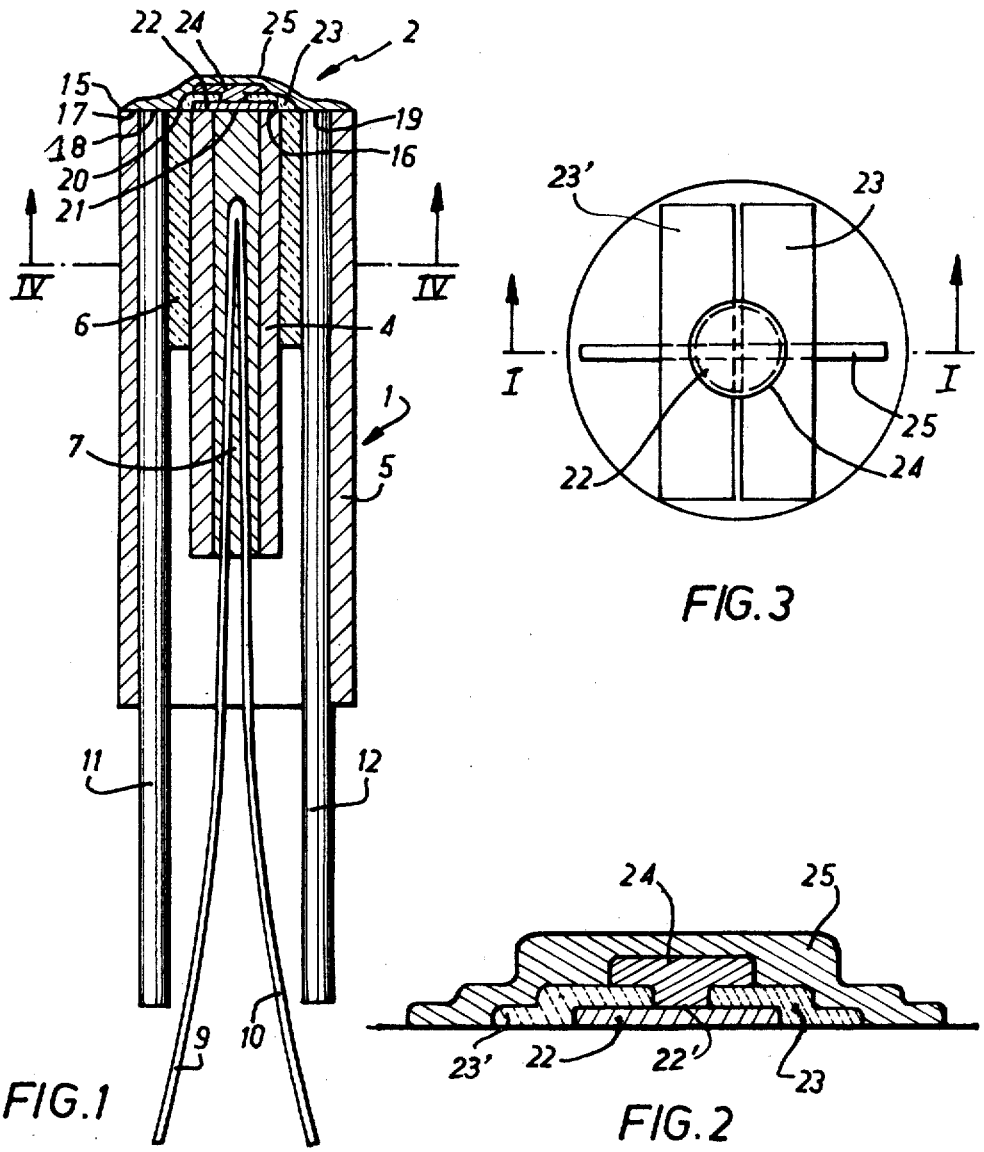
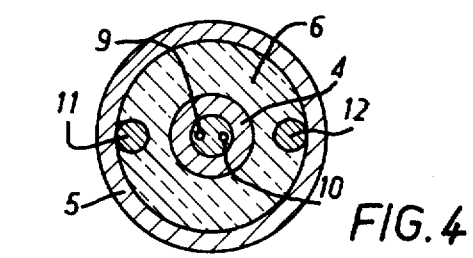

JOSEPHSON JUNCTION

The present invention relates to a Josephson junction, namely an electrical device comprising a thin and substantially insulating electrical barrier, and more particularly a semi-conductive barrier, between two electrodes of superconductive metal, the whole being arranged on a supporting substrate.

It is known that when the superconductive electrodes are cooled to the superconducting temperature, the Josephson junction may be employed on alternating current and permits the detection and/or the emission of electro-magnetic fields of very high frequency. However, in the Josephson junctions which are at present known, and more particularly in the Josephson junctions of the point type, the constituent parts have a size comparable with the wave-length of alternating fields of high frequency, so that junctions of this kind cause considerable disturbance in the configuration of the electromagnetic field in the immediate vicinity of the active portion of the junction. The result of this is that the interpretation of signals delivered by the junction proves to be very awkward if not impossible.

The invention has for its object the provision of a new structure of Josephson junction which is such that it causes much less disturbance of the electromagnetic field in the immediate vicinity of this junction. Another object of the invention is the provision of a Josephson junction of the above-mentioned type which is subjected to considerably reduced electrical stresses resulting from thermal cycles.

According to the invention, the supporting substrate, incorporating electric supply means, forms a junction supporting plane and extends substantially in a direction perpendicular to the said plane, while the electric supply means incorporated in the said supporting substrate extends in the said direction until they come level with the said plane, at least the first superconductive electrode having a restricted contour so as to extend up to the level of the supply conductor with which it is associated, while the second superconductive electrode extends beyond the contour of the said first electrode until it comes into contact with a supply conductor with which it is associated.

This arrangement, which transfers on one side of the plane of the junction, that is to say on the side opposite to the active portion of the said junction, the assembly of the supporting substrate and the electric supply conductors, makes it possible to obtain the two advantages referred to above. In fact, on the one hand by localizing the whole of the supply conductors on this side of the junction with respect to the space subjected to the electromagnetic field, it is quite certain that any disturbance of this magnetic field by the effect of these electric supply conductors is avoided. On the other hand, this arrangement makes it easy to give the supporting substrate a cylindrical form, which permits its easy insertion into a wave-guide.

Another aspect of the invention concerns an improved electrode of the type referred to above. In this type of electrode, in fact, the super-conductive materials utilized in forming one or two electrodes of a Josephson junction are, amongst others, lead, tin and niobium.

The disadvantage of junctions of this kind is the lack of resistance to thermal cycles which are repeated between the ambient temperature and the super-conductivity temperature of the order of 4° K. While lead and tin are easy to use, the thin poly-crystalline layers re-crystallize on returning to the ambient temperature, which creates a risk of destruction of the barrier of oxide or semi-conductor formed on the thin layer. On the contrary, other metals such as niobium or its alloys, the super-conducting temperature of which is of the order of 9° K, whether they are utilized in the form of a thin layer or in the solid form, have a very good behaviour to heat cycles by reason of their mechanical properties.

However, due to its very great reactivity, especially with respect to the oxygen of air, any external face of a body of niobium is always highly polluted. It is therefore necessary, in order to utilize niobium as the barrier supporting electrode of a Josephson junction, to pickle the chosen zone and to provide subsequently for an easy operation of oxidation or deposit of a semi-conductor in order to form a suitable electric barrier. Experience has shown that such an arrangement of an insulating barrier on a super-conductive electrode is entirely reliable with respect to heat cycles.

Still another aspect of the invention relates to an application and a special adaptation of this technique to Josephson junction according to the invention, in which at least one conductor associated with the first electrode is made of super-conductive material, for example of niobium or tantalum or vanadium or their alloys, and the location of the said super-conductive conductor in the flat face of the supporting substrate constitutes the said first junction electrode, while the second electrode is constituted in a manner known per se by a deposit in a thin layer of a super-conductive material.

This application has the particular feature of taking advantage of all the best features of use of super-conductors such as those enumerated above, without being troubled by their disadvantages. In fact, since it is the end face, suitably polished and then pickled by means of a treatment by ionic bombardment, of a solid conductor of a super-conductive metal such as niobium or tantalum or vanadium or their alloys, which constitutes one of the electrodes, it will be understood that on the one hand the always difficult operation of depositing a super-conductive film of a material of the kind enumerated above, can be eliminated since it is only necessary to polish and pickle transversely a cylindrical supporting substrate in which are embedded longitudinal conductors of super-conductive material so as to form the electrode, while on the other hand, when this pickling is once completed, it is easy to ensure by conventional techniques the formation of a thin layer of oxide, for example of niobium oxide at the zone where the super-conductor is level with the surface.

A junction of this kind thus has the important advantage of avoiding the use of any difficult operation of deposit of a thin film of niobium or other super-conductor, which must be carried out under a very high vacuum of about $10^{-8}$ torr by evaporation or cathode spraying, with the use of masks which enable the contours of the deposits to be accurately defined.

The described use of super-conductors such as niobium in accordance with the invention, to form the electrode, necessitates only a relatively simple operation of polishing and careful pickling or fettling. In addition, if the active portion of the junction becomes damaged, it is necessary only to carry out a re-polishing and ionic fettling operation in order to reconstitute the vital element of the junction, of which one electrode is formed by an end face of a super-conductor such as niobium. Such facility of reconstitution of the junction makes it furthermore possible successively to prepare junctions of different natures, suitable for use under different experimental conditions, starting with the same supporting substrate.

Another advantage of a junction of this kind utilized in hyper-frequency devices is to be able to use the super-conductor itself as the antenna loop in order to bring the high-frequency current to the junction while providing however measures for improving the electric coupling between the junction and the external radiating medium.

The characteristic features and advantages of the invention will furthermore be brought out in the description which follows below, by way of example, reference being made to the accompanying drawings, in which:

FIG. 1 represents in cross-section a JOSEPHSON junction according to the invention;

FIG. 2 is an enlarged view of a detail of FIG. 1;

FIG. 3 is a view looking on the top of this junction;

FIG. 4 is a cross-section taken along the line IV—IV of FIG. 1;

Figure 5:
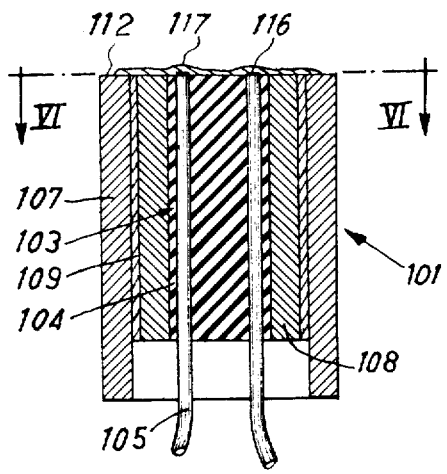
FIG. 5 is a view in axial section of a junction according to the invention.

Referring to FIGS. 1 and 2, a junction according to the invention is essentially constituted by a supporting substrate 1, on which is arranged the active portion 2 of the junction. The supporting substrate 1 is in this case constituted by coaxial cylindrical tubes 4 and 5 separated by an insulator 6. The tubes 4 and 5 are advantageously composed of a metal such as "Kovar", while the insulator 6 is advantageously of glass. The mass of conductive filling 7 inside the internal cylinder 4 is advantageously composed of a super-conductive substance, for example PbSn, in which are embedded two copper conductors 9 and 10.

Similarly, in the insulator 6 formed between the internal tube 4 and the external tube 5 are embedded supply conductors 11 and 12 which are preferably made of Kovar and are welded to the external tube 5. The supporting substrate 1 thus defines a supporting plane 15, on which are located annular surface-level zones 16 for the internal tube 4 and 17 for the external tube 5, and small circular surface-level zones 18 and 19 for the conductors 11 and 12, while the space comprised between these zones 16, 17, 18 and 19, is essentially constituted by an insulating surface zone 20. The surface zone 16 of the internal tube itself circumscribes a circular conductive surface zone 21 of the super-conductive filling mass 7. The whole is suitably ground in order to form a regulated plane for the formation of the junction following the technique of deposit in a thin layer of the junction, as will now be described.

The active portion of the junction 2 comprises essentially a first electrode in the form of a metal blade 22 which has a substantially restricted contour confined to the diameter of the internal tube 4. Above this first blade 22 are deposited two insulating films 23 and 23' defining an active portion 22' of the blade 22. The active portion 22' is covered with a semi-conductive barrier 24 while a second electrode in the form of a super-conductive blade 25 overlies the whole width of the junction and extends up to the peripheral edge of the supporting substrate until it overlies the annular surface-level 17 of the external cylinder 5 and the surface-level zones 18 and 19 of the conductors 11 and 12.

A junction of this kind is advantageously formed by successive deposits by vaporization of a super-conductive metal, insulating material and a semi-conductive metal forming the barrier. Although this has not been shown in the drawing, the whole of the junction may be protected by an external screen of $SiO_2$ for example, of very small thickness.

It will be observed that the electric supply conductors are four in number, which makes it possible to choose for example the conductor 9 and the conductor 11 for the voltage supply, while the conductor 10 and the conductor 12 are chosen for the current supply. As can clearly be seen, this arrangement makes it possible, in particular for laboratory tests, to evaluate the actual resistance of the junction without taking account of the auxiliary resistances due to the conductors.

In use, a Josephson junction of this kind is placed in a space in which there exists a high-frequency electromagnetic field, in such manner that in particular the plane 15 of the junction support is arranged in the plane which contains the electro-magnetic waves. For example, if the Josephson junction is placed in a wave-guide, the supporting substrate of the Josephson junction has preferably a cylindrical shape which allows it to slide freely inside this wave-guide. It will be understood that this arrangement, which places facing the high-frequency electro-magnetic field only the active elements of the junction in the form of structural parts of very small thickness, in any case having a thickness very much less than the electro-magnetic wave-lengths co-operating with the junction, causes no disturbance in the spatial distribution of the electro-magnetic field.

The whole of the supporting substrate is advantageously composed of a material having a coefficient of expansion at least substantially in the vicinity of that of the semi-conductor material forming the junction. In this way, any dislocation in the structure of the semi-conductor material is avoided, the effect of such dislocation being to dope the semi-conductor and consequently to modify its electrical characteristics.

Figure 6:
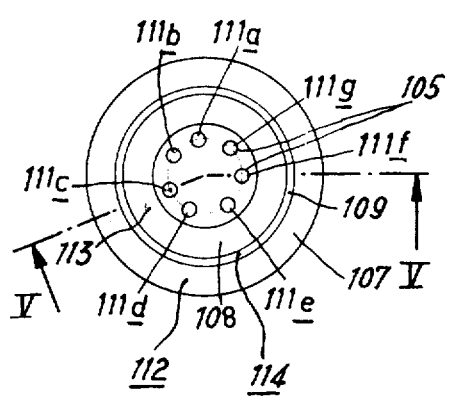
FIG. 6 is a view in radial transverse section taken along the line VI—VI of FIG. 5.
Figure 7:
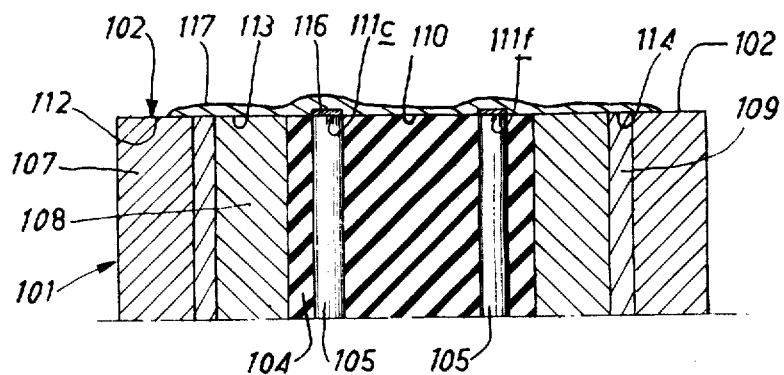
FIG. 7 is a view to a larger scale of the active portion of the junction shown in FIG. 5.
Figure 8:
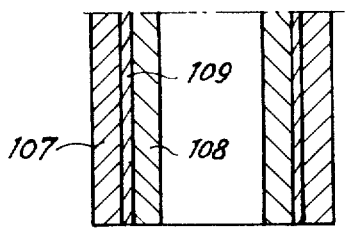
FIGS. 8 to 13 show diagrammatically the various phases of preparation of a junction according to the invention.
Figure 11:
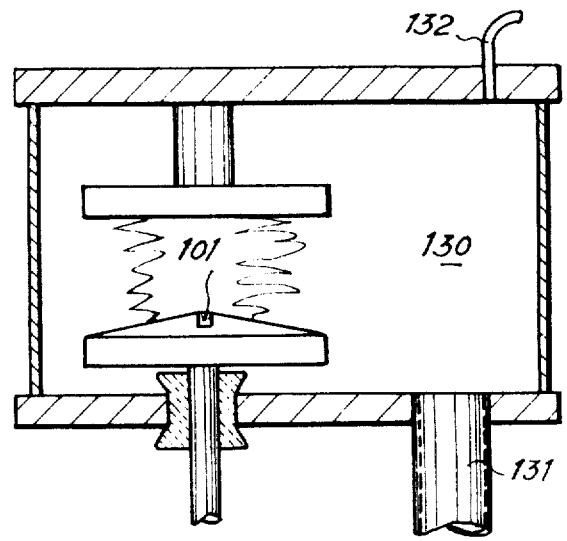
Figure 9:
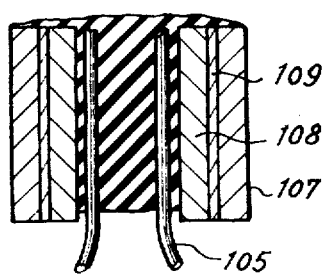

Referring now to FIGS. 5 to 7, a junction according to the invention is constituted by a supporting substrate 101 of cylindrical shape, having a radial supporting plane face 102 terminating one extremity of the supporting substrate.

The supporting substrate is constituted by a central portion 103 with an insulating matrix 104, in which is embedded a bunch (for example seven) of niobium wires 105 serving as central supply conductors. Around the matrix 103 are arranged two cylindrical sleeves 107 and 108 of metal, for example copper, between which is inserted a layer 109 of a super-conductive material, for example the "welding material" Pb-Sn.

The matrix 104 with the niobium conductors 105, together with the sleeves 107 and 108 and the super-conductive layer 109 have respectively surface-level extremities 110 (for the matrix 104), 111a, 111b, 111c, 111d, 111e, 111f, and 111g, for the seven niobium wires 105. These surface-level extremities are annular surfaces 112, 113, 114 respectively for the sleeves 107 and 108 and the layer 109, which are of annular shape and circular for the wires 105. All these surface-level extremities 110, 111a, 111b, 111c, 111d, 111e, 111f, 111g, 112, 113 and 114 are arranged in the radial plane 102 of the junction or the supporting plane-face of the junction.

The surface-level extremities 111a to 111g of the seven niobium wires 105 each has a fine layer of oxidized niobium 116 or a semi-conductor, and the supporting plane face 102 is covered with a thin film 117 of lead having an extension such that it covers, at least partially, the super-conductive layer 109.

In this way, seven junctions are obtained: niobium (111a to 111g) — niobium oxide or semi-conductor 116 — lead 117. The metal end face (unoxidized) 111a to 111g of the niobium wires constitutes one of the individual junction electrodes, while the lead film 117 constitutes a second electrode common to all the junctions. The electric barrier of each elementary junction is formed by the fine layer of oxidized niobium 116.

It can be seen that in this way seven elementary junctions have been produced, each supplied on one side by the individual conductors 105 and on another side by the super-conductive layer 109. These junctions can therefore be supplied individually or simply in parallel.

The production of a junction of this kind is effected in the following manner. Referring now to FIGS. 8 to 13, cylindrical copper sleeves 107 and 108 are prepared, the external diameter of the internal cylinder 108 being smaller by a few tenths of a millimeter than the internal diameter of the cylinder 107, and the cylinders 107 and 108 are joined together by welding 109 by means of a super-conductive metal which is advantageously Pb-Sn (becoming super-conductive at 4.2° K) (see FIG. 8). In the interior of the assembly formed by the two sleeves 107 and 108 are placed the seven niobium wires 105 arranged in an annular ring and the whole is rendered solid with epoxy resin, for example with Araldite (see FIG. 9). After polymerization of the resin, the front surface is mechanically polished (FIG. 10, grinding wheel 120) also causing the appearance of a flat face 102 and the surface-level extremities previously described.

The surface condition of the surface-level extremities 111a, 111b, 111c, 111d, 111e, 111f, and 111g, is perfected by giving the supporting substrate thus obtained a finish cleaning by ionic bombardment, by placing this supporting substrate 101 in the cathode position of a cathode atomization apparatus 130 (FIG. 11), with a pumped vacuum 131 and under an inert gas such as argon or krypton, introduced at 132, the atmosphere of neutral gas being of the order of $4 \times 10^{-3}$ torr and this operation is effected for a period of time sufficient to obtain a surface condition perticularly free from roughness.

Figure 12:
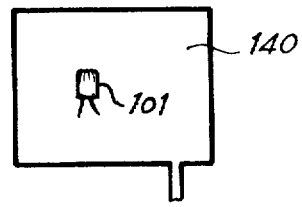
Figure 10:
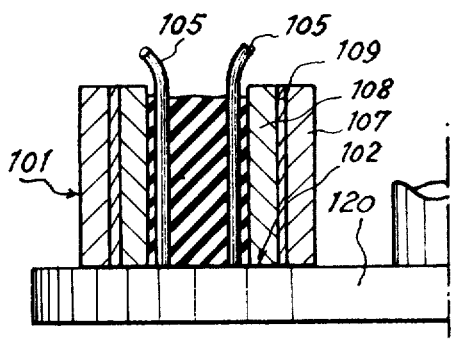
Figure 13:
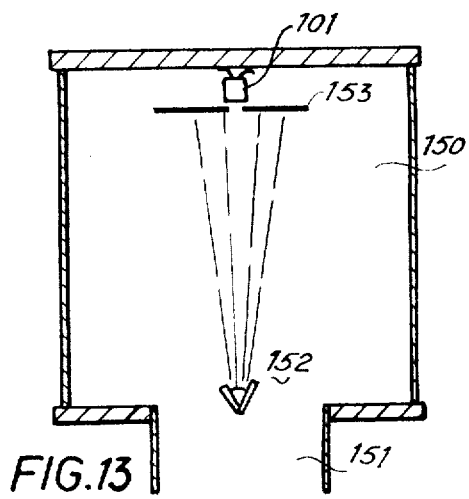

The oxidation of the niobium surface-level extremities is then carried out, either with pure, dry oxygen or in a moist atmosphere at about 150° C. in a chamber 140 (see FIG. 12). The final operation consists of depositing the film of lead 117 by evaporation under vacuum in a vacuum bell 150 (pumped at 151) by utilizing a lead evaporation crucible 152 and a mask 153 which defines exactly the surface which is to be covered by the lead film (see FIG. 13).

There has been described above a Josephson junction with an insulating barrier formed by an oxide of a metal constituting one of the electrodes, in the present case a barrier of niobium oxide. Instead of producing such a barrier which is purely insulating, it is also possible, within the scope of the present invention, to produce this electric barrier in other insulating material or as a semi-conductor which would be deposited, following the usual techniques of depositing thin layers, either individually on each surface-level extremity 111a to 111g, or in a single layer covering all the extremities while remaining at a radial distance from the extremity 113 of the internal sleeve 108.

The Josephson junction according to the invention can be utilized in the whole field of high-frequency waves, especially in millimetric and sub-millimetric spectroscopy, in astronomic detection or in telecommunications.

What we claim is:

1. A Josephson junction comprising a cylindrical supporting substrate that has a flat end face disposed in a plane perpendicular to the axis of the cylindrical substrate, said cylindrical substrate comprising a body of insulating material elongated in a direction parallel to the axis of said cylindrical substrate and first and second electrical conductor means extending longitudinally along and spaced from each other by said insulating material, said body of insulating material and said electrical conductor means terminating respectively in a transverse insulating zone and first and second conductive zones, all said zones forming said flat end face, a first blade of superconductive material extending face-on-face exclusively on said first conductive zone, an electrical barrier film on said first blade of superconductive material, and a second blade of superconductive material disposed face-on-face on said electrical film barrier and extending transversely along said flat end to said second conductive zone.

2. A Josephson junction as claimed in claim 1, said first electrical conductor means comprising a central metal tube filled with superconductive material.

3. A Josephson junction as claimed in claim 2, said second electrical conductor means comprising an outer tube disposed axially outside said central metal tube and wires of superconductive material extending longitudinally to said end face along and in contact with said outer tube.

4. A Josephson junction as claimed in claim 1, said barrier film being semi-conductive material.

5. A Josephson junction as claimed in claim 1, said first electrical conductor means comprising a plurality of wires of superconductive material embedded in said body if insulating material and terminating in an annular series of elemental zones forming one of said first and second conductive zones.

6. A Josephson junction as claimed in claim 1, said second electrical conductor means being a pair of concentric metal sleeves having a layer of superconducting material between said sleeves and terminating in said end face.

* * * * *